(12) United States Patent
Li

(10) Patent No.: US 10,199,382 B2
(45) Date of Patent: Feb. 5, 2019

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/821,422

(22) Filed: Nov. 22, 2017

(65) Prior Publication Data

US 2018/0151573 A1    May 31, 2018

(30) Foreign Application Priority Data

Nov. 30, 2016 (CN) .......................... 2016 1 1082506

(51) Int. Cl.
*H01L 21/28* (2006.01)
*H01L 27/11* (2006.01)
(Continued)

(52) U.S. Cl.
CPC .... *H01L 27/1104* (2013.01); *H01L 21/28079* (2013.01); *H01L 21/28088* (2013.01);
(Continued)

(58) Field of Classification Search
CPC ............... H01L 29/785; H01L 29/4958; H01L 21/28079; H01L 21/823821;
(Continued)

(56) References Cited

U.S. PATENT DOCUMENTS

| 7,732,872 | B2 * | 6/2010 | Cheng | H01L 29/4966 |
| | | | | 257/213 |
| 7,911,008 | B2 * | 3/2011 | Chen | H01L 27/1104 |
| | | | | 257/368 |

(Continued)

OTHER PUBLICATIONS

The European Patent Office (EPO) The Extended European Search Report for 17204264.0 dated Apr. 10, 2018 7 Pages.

*Primary Examiner* — Savitr Mulpuri
(74) *Attorney, Agent, or Firm* — Anova Law Group, PLLC

(57) ABSTRACT

A method for fabricating a semiconductor device includes forming a gate dielectric layer on a base substrate including an N-type logic region, a P-type logic region, a first pull down transistor (PDT) region, a second PDT region, and a pass gate transistor (PGT) region, forming a first work function layer (WFL) in the first N-type threshold-voltage (TV) region, the P-type logic region, the second PDT region, and the PGT region, forming a second WFL on the first WFL in the first P-type TV region, and forming a third WFL on the second WFL in the first P-type TV region, the first WFL in the second P-type TV region, and the gate dielectric layer in the second N-type TV region and the first PDT region. The thickness of the third WFL is smaller than the thickness of the first WFL. The method further includes forming a fourth WFL on the substrate.

13 Claims, 5 Drawing Sheets

(51) Int. Cl.
  *H01L 21/8238* (2006.01)
  *H01L 29/66* (2006.01)
  *H01L 27/092* (2006.01)
  *H01L 29/423* (2006.01)
  *H01L 29/49* (2006.01)

(52) U.S. Cl.
  CPC .......... *H01L 21/82385* (2013.01); *H01L 21/823821* (2013.01); *H01L 21/823842* (2013.01); *H01L 21/823857* (2013.01); *H01L 27/0922* (2013.01); *H01L 27/0924* (2013.01); *H01L 27/1116* (2013.01); *H01L 29/42372* (2013.01); *H01L 29/4958* (2013.01); *H01L 29/4966* (2013.01); *H01L 29/66545* (2013.01)

(58) Field of Classification Search
  CPC ............ H01L 27/1104; H01L 27/1116; H01L 21/823842; H01L 21/28088; H01L 29/517; H01L 29/66545; H01L 21/82385; H01L 27/0922
  See application file for complete search history.

(56) References Cited

U.S. PATENT DOCUMENTS

| | | |
|---|---|---|
| 9,502,416 B1 * | 11/2016 | Kim ............... H01L 27/1116 |
| 9,640,540 B1 * | 5/2017 | Liaw ................ G11C 11/419 |
| 2009/0108371 A1 * | 4/2009 | Nakayama ...... H01L 21/823814 257/379 |
| 2009/0108372 A1 | 4/2009 | Chen et al. |
| 2011/0007596 A1 | 1/2011 | Lee et al. |
| 2011/0317485 A1 | 12/2011 | Liaw |
| 2018/0151451 A1 * | 5/2018 | Li ..................... H01L 21/28088 |
| 2018/0151575 A1 * | 5/2018 | Li ....................... H01L 29/785 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201611082506.7, filed on Nov. 30, 2016, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

In current semiconductor industry, integrated circuit (IC) products mainly include three types of devices: logic devices, memory devices, and analog circuits. Among these three types of devices, memory devices account for a large proportion of the IC products. With the development of semiconductor technology, in order to expand the application range of memory devices, it is necessary to simultaneously form memory devices together with other types of devices on a same chip to form an embedded semiconductor memory device. For example, to embed a memory device in a central processing unit (CPU), the memory device may need to be compatible with the embedded CPU platform, and the original specifications and the corresponding electrical performance of the memory device may need to be retained.

Usually, the memory device may need to be compatible with the embedded standard logic device. For an embedded semiconductor device, the device may often include a logic region and a storage region. The logic region may usually include a plurality of logic devices, the storage region may include a plurality of memory devices. With the development of memory technology, various types of semiconductor memories such as static random access memories (SRAMs), dynamic random access memories (DRAMs), erasable programmable read-only memories (EEPROMs), flash memories, etc. have emerged. Among the various types of semiconductor memories, SRAM devices demonstrate a number of advantages such as low energy-consumption, relatively-fast operation speed, etc. Therefore, SRAM devices and the corresponding fabrication methods have attracted more and more attention.

However, the electrical performance of SRAMs in semiconductor devices formed by conventional methods may still need to be improved. The disclosed semiconductor devices and fabrication methods thereof are directed to solve one or more problems set forth above and other problems in the art.

BRIEF SUMMARY OF THE DISCLOSURE

One aspect of the present disclosure includes a method for fabricating a semiconductor device. The method includes providing a base substrate including an N-type logic region, a P-type logic region, a first pull down (PD) transistor region, a second PD transistor region, and a pass gate (PG) transistor region. The N-type logic region includes a first N-type threshold-voltage (TV) region used to form a first N-type device and a second N-type TV region used to form a second N-type device. The P-type logic region includes a first P-type TV region used to form a first P-type device and a second P-type TV region used to form a second P-type device. The method also includes forming a gate dielectric layer on a portion of the base substrate in the N-type logic region, the P-type logic region, the first PD transistor region, the second PD transistor region, and the PG transistor region, forming a first work function (WF) layer on the gate dielectric layer in the first N-type TV region, the P-type logic region, the second PD transistor region, and the PG transistor region, forming a second WF layer on the first WF layer in the first P-type TV region, and forming a third WF layer on the second WF layer in the first P-type TV region, the first WF layer in the second P-type TV region, and the gate dielectric layer in the second N-type TV region and the first PD transistor region. The thickness of the third WF layer is smaller than the thickness of the first WF layer. The method further includes forming a fourth WF layer on the third WF layer in the P-type logic region, the second N-type TV region, and the first PD transistor region, and on the first WF layer in the first N-type TV region, the second PD transistor region, and the PG transistor region.

Another aspect of the present disclosure provides a semiconductor device. The semiconductor device includes a base substrate including an N-type logic region, a P-type logic region, a first pull down (PD) transistor region, a second PD transistor region, and a pass gate (PG) transistor region. The N-type logic region includes a first N-type threshold-voltage (TV) region used to form a first N-type device and a second N-type TV region used to form a second N-type device. The P-type logic region includes a first P-type TV region used to form a first P-type device and a second P-type TV region used to form a second P-type device. The semiconductor device also includes a gate dielectric layer formed on a portion of the base substrate in the N-type logic region, the P-type logic region, the first PD transistor region, the second PD transistor region, and the PG transistor region, a first WF layer on the gate dielectric layer in the first N-type TV region, the P-type logic region, the second PD transistor region, and the PG transistor region, a second WF layer formed on the first WF layer in the first P-type TV region, and a third WF layer formed on the second WF layer in the first P-type TV region, the first WF layer in the second P-type TV region, and the gate dielectric layer in the second N-type TV region and the first PD transistor region. The thickness of the third WF layer is smaller than the thickness of the first WF layer. The semiconductor device further includes a fourth WF layer formed on the third WF layer in the P-type logic region, the second N-type TV region, and the first PD transistor region, and on the first WF layer in the first N-type TV region, the second PD transistor region, and the PG transistor region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

An SRAM device mainly includes a plurality of pull up (PU) transistors, pull down (PD) transistors, and pass gate (PG) transistors. For a memory device, the read margin plays a key role in the performance of the device. Therefore, when the read margin of a memory device is improved, the product yield of the memory device may be improved, and the overall performance of the semiconductor device will also be improved.

Further, the read margin of a memory device is proportional to the beta ratio of the memory device. Specifically, the beta ratio refers to the ratio of the open-state current of the PD transistor to the open-state current of the PG transistor.

For a memory unit of a memory device with a '122' structure, the memory unit includes a PU transistor, two PD transistors, and two PG transistors. Usually, the work function (WF) layers in the two PD transistors are identical with the WF layer in an N-type standard threshold-voltage (TV) logic device and the WF layers in the two PG transistors are identical with the WF layer in an N-type low TV logic device. When the open-state current of one or both of the two PD transistors is improved and the open-state current of the PG transistors is reduced, the beta ratio of the memory device may be improved.

Figure 12:
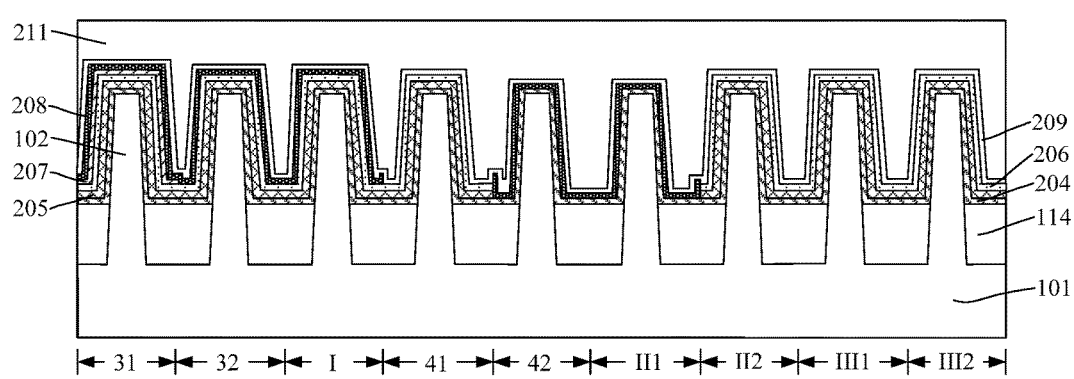
Figure 13:
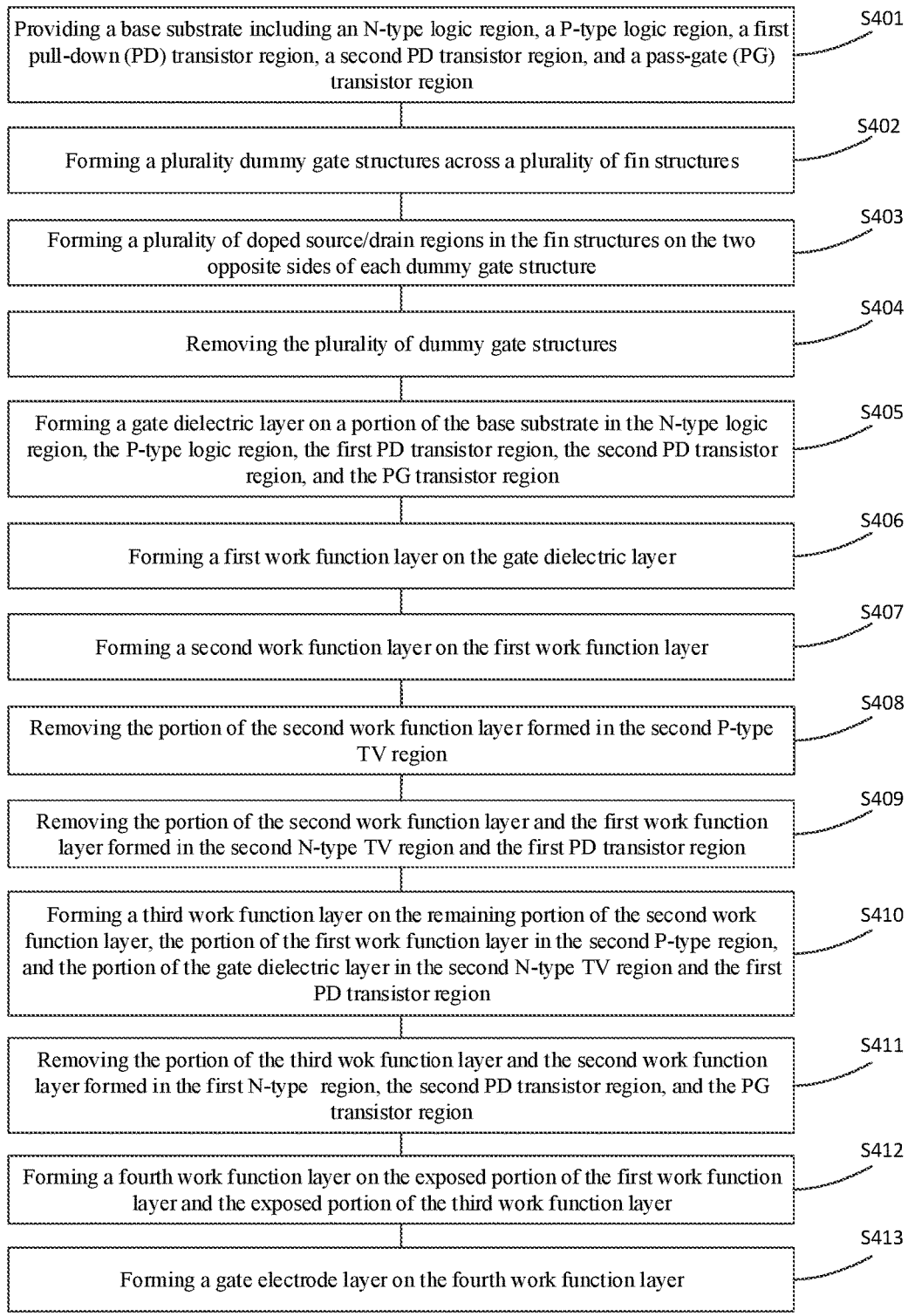
FIG. 13 illustrates a flowchart of an exemplary method for fabricating a semiconductor device consistent with various disclosed embodiments in the present disclosure.

The present disclosure provides a method for fabricating semiconductor devices. FIG. 13 illustrates a flowchart of an exemplary method for fabricating a semiconductor device consistent with various disclosed embodiments in the present disclosure. FIGS. 1-12 illustrate schematic views of semiconductor structures at certain stages of the exemplary fabrication process.

Figure 1:
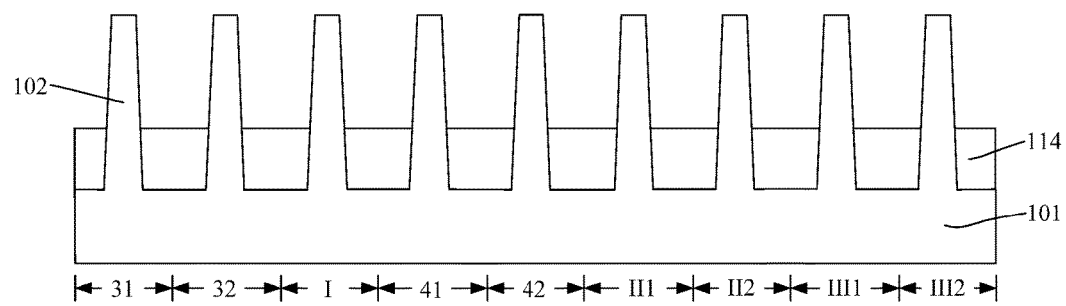
FIGS. 1-12 illustrate schematic views of semiconductor structures at certain stages of an exemplary fabrication process for a semiconductor device consistent with various disclosed embodiments in the present disclosure.

Referring to FIG. 13, at the beginning of the fabrication process, a base substrate is provided (S401). FIG. 1 shows a schematic cross-section view of a corresponding semiconductor structure.

Referring to FIG. 1, a base substrate is provided. The base substrate may include an N-type logic region (not labeled), a P-type logic region (not labeled), a first PD transistor region II1, a second PD transistor region II2, and a PG transistor region (not labeled). The N-type logic region may include a first N-type TV region 41 used to form a first N-type device, and a second N-type TV region 42 used to form a second N-type device. The threshold voltage of the first N-type device may be larger than the threshold voltage of the second N-type device. The P-type logic region may include a first P-type TV region 31 used to form a first P-type device, and a second P-type TV region 32 used to form a second P-type device. The threshold voltage of the first P-type device may be smaller than the threshold voltage of the second P-type device.

In one embodiment, the semiconductor device to be formed may include a logic device and an SRAM device. Accordingly, the N-type logic region may provide a process platform for subsequent formation of an N-type device, the P-type logic region may provide a process platform for subsequent formation of a P-type device, the first PD transistor region II1 may provide a process platform for subsequent formation of a first PD transistor, the second PD transistor region II2 may provide a process platform for subsequent formation of a second PD transistor, and the PG transistor region may provide a process platform for subsequent formation of PG transistors.

Moreover, the first PD transistor and the second PD transistor may together serve as PD transistors of the SRAM in the semiconductor device. The first PD transistor region II1 may be an N-type metal-oxide-semiconductor (NMOS) region, the second PD transistor region II2 may be an NMOS region, and the PG transistor region may also be an NMOS region.

In one embodiment, the base substrate may include a PU transistor region I, the PU transistor region I may provide a process platform for subsequent formation of PU transistors. The PU transistor region I may be a P-type metal-oxide-semiconductor (PMOS) region.

Moreover, in order to improve the current in the SRAM device, the PG transistor region may further include a first PG transistor region III1 and a second PG transistor region III2 adjacent to the first PG transistor region III1. The first PG transistor region III1 may provide a process platform for subsequent formation of a first PG transistor and the second PG transistor region III2 may provide a process platform for subsequent formation of a second PG transistor. The first PG transistor and the second PG transistor may together serve as PG transistors of the SRAM in the semiconductor device. In one embodiment, the first PG transistor region III1 and the second PG transistor region III2 may both be NMOS regions.

In one embodiment, the first N-type TV region 41 may be an N-type standard TV region, and the second N-type TV region 42 may include an N-type ultra-low threshold-voltage (ULTV) region and an N-type low TV region. In other embodiments, the second N-type TV region may include only an N-type low TV region.

In one embodiment, the first P-type TV region 31 may include a P-type ULTV region and a P-type low TV region, and the second P-type TV region 32 may be a P-type standard TV region. In other embodiments, the first P-type TV region may only include a P-type low TV region.

For illustration purpose, as an example, the semiconductor device to be formed is described to be a fin field-effect transistor (Fin-FET) device, although any suitable transistors may be encompassed within the scope of present disclosure. The base substrate may include a substrate 101 and a plurality of discrete fin structures 102 formed on the substrate 101. In order to electrically isolate neighboring fin structures 102 and isolate neighboring devices, the base substrate may also include an isolation structure 114 formed on the portion of the substrate 101 exposed by the plurality of fin structures 102. The isolation structure 114 may cover a portion of the sidewall surfaces of each fin structure 102 and the top surface of the isolation structure 114 may be lower than the top surfaces of the fin structures 102.

The isolation structure 114 may be made of $SiO_x$, $SiN_x$, SiON, or any other appropriate material. In one embodiment, the isolation structure 114 is made of $SiO_x$.

In other embodiments, the semiconductor device to be formed may be a planar transistor device. Accordingly, the base substrate may be a planar base substrate. The planar base substrate may be made of silicon, germanium, SiGe, SiC, silicon on insulator (SOI), germanium on insulator (GOI), glass, III-V group compound (such as GaN, GaAs, etc.), or any other appropriate semiconductor material or structure. Further, a plurality of the gate structures may be formed on the surface of the planar substrate.

The substrate 101 may be made of silicon, germanium, SiGe, SiC, GaAs, InAs, or any other appropriate semiconductor material. The substrate 101 may also be made SOI or GOI. The plurality of fin structures 102 may be made of silicon, germanium, SiGe, SiC, GaAs, InAs, or any other appropriate semiconductor material. In one embodiment, the substrate 101 is made of silicon and the fin structures 102 is also made of silicon.

Moreover, in one embodiment, prior to forming a gate dielectric layer, the fabrication process may include performing a first N-type TV doping adjustment process on the portion of the base substrate corresponding to the N-type ULTV region, performing a second N-type TV doping adjustment process on the portion of the base substrate corresponding to the N-type low TV region, performing a first P-type TV doping adjustment process on the portion of the base substrate corresponding to the P-type ULTV region, and performing a second P-type TV doping adjustment process on the portion of the base substrate corresponding to the P-type low TV region.

Specifically, the doping ions used in the first N-type TV doping adjustment process and the second N-type TV doping adjustment process may be N-type ions, including P ions, As ions, Sb ions, etc. The doping concentration introduced in the first N-type TV doping adjustment process may be lower than the doping concentration introduced in the second N-type TV doping adjustment process. Moreover, the doping ions used in the first P-type TV doping adjustment process and the second P-type doping adjustment process may be P-type ions, including B ions, Ga ions, In ions, etc. The doping concentration introduced in the first P-type TV doping adjustment process may be lower than the doping concentration introduced in the second P-type TV doping adjustment process.

Figure 2:
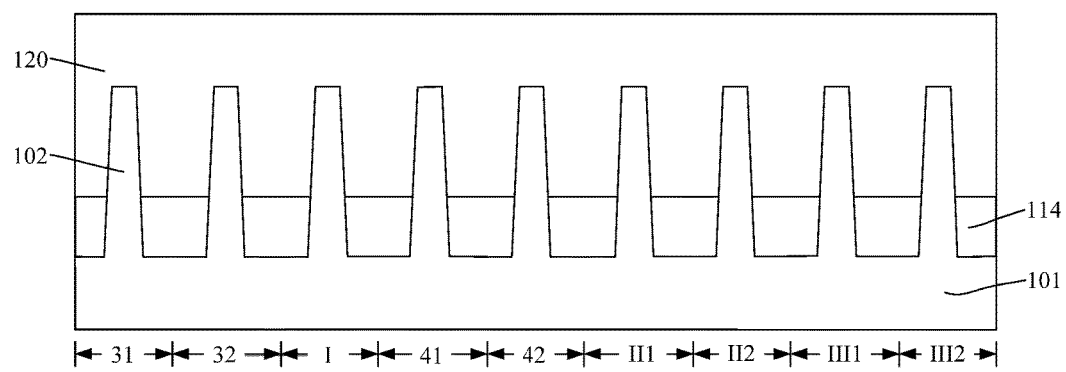

Further, returning to FIG. 13, a plurality of dummy gate structures may be formed across the plurality of fin structures (S402). FIG. 2 shows a schematic cross-section view of a corresponding semiconductor structure.

In one embodiment, a high-k last metal last process may be adopted to form a plurality of gate structures. Therefore, the fabrication process may include forming a plurality of dummy gate structures 120 on the portion of the base substrate in the N-type logic region, the P-type logic region, the first PD transistor region II1, the second PD transistor region II2, and the PG transistor region.

Referring to FIG. 2, a plurality of dummy gate structures 120 may be formed on the base substrate across the plurality of fin structures 102. The plurality of dummy gate structures 120 may be used to occupy spaces for a plurality of subsequently-formed gate structures of the semiconductor device. Specifically, the plurality of dummy gate structures 120 may be formed on the isolation structure 114 across the plurality of fin structures 102. The dummy gate structures 120 may cover a portion of the top and the sidewall surfaces of each fin structure 102.

The dummy gate structure 102 may have a single-layer structure or a multiple-layer structure. The dummy gate structure 102 may include a dummy gate layer or may include a dummy oxide layer and a dummy gate layer formed on the dummy oxide layer. The dummy gate layer may be made of poly-crystalline silicon, $SiO_x$, $SiN_x$, SiON, SiC, SiCN, SiCON, or amorphous silicon. The dummy oxide layer may be made of $SiO_x$ or SiON.

In one embodiment, the dummy gate structure 120 may also be formed on the portion of the base substrate in the PU transistor region I.

In one embodiment, the dummy gate structure 120 may be formed across the N-type logic region, the P-type logic region, the first PD transistor region II1, the second PD transistor region II2, the PG transistor region, and the PU transistor region I. In other embodiments, the dummy gate structures formed in different regions of the base substrate may be independent from each other. That is, the dummy gate structures formed in different regions of the base substrate may not be connected with each other.

Further, referring to FIG. 13, a plurality of doped source/drain regions may be formed (S403). Specifically, after forming the dummy gate structures 120, the plurality of doped source/drain regions (not shown) may be formed in each fin structure 102 on the two opposite sides of the corresponding dummy gate structure 120.

Figure 3:
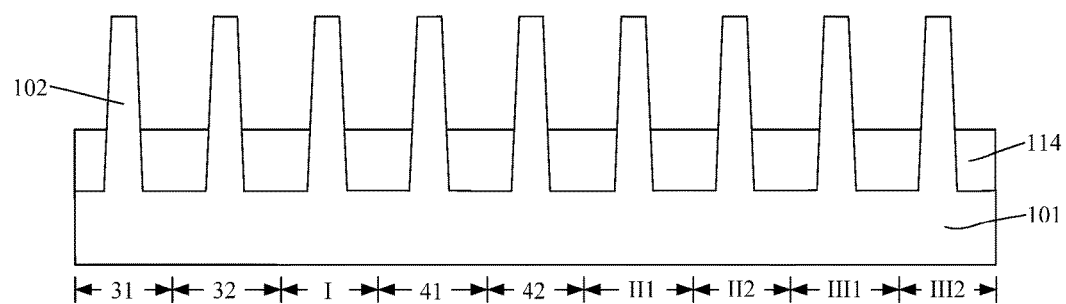

Further, returning to FIG. 13, the plurality of dummy gate structures may be removed after forming the plurality of doped source/drain regions (S404). FIG. 3 shows a schematic cross-section view of a corresponding semiconductor structure. It may be noted that FIG. 3 illustrates a cross-section view in a direction perpendicular to a length direction of the fin structure 102, while, along the length direction of the fin structure 102, doped source/drain regions (not illustrated) may be formed in the each fin structure 102 on the two opposite sides of the removed corresponding dummy gate structure 120.

Referring to FIG. 3, after forming the plurality of doped source/drain regions, the plurality of dummy gate structures 120 (referring to FIG. 2) may be removed. In one embodiment, the plurality of dummy gate structures 120 may be removed by a dry etching process, a wet etching process, or a SiCoNi etching process.

Moreover, prior to removing the plurality of dummy gate structures 120, the fabrication process may include forming an interlayer dielectric layer (not shown) on the portion of the base substrate exposed by the dummy gate structures 120. The interlayer dielectric layer may expose the top surfaces of the plurality of dummy gate structures 120. That is, the interlayer dielectric layer may not cover the top surfaces of the plurality of dummy gate structures 120.

Figure 4:
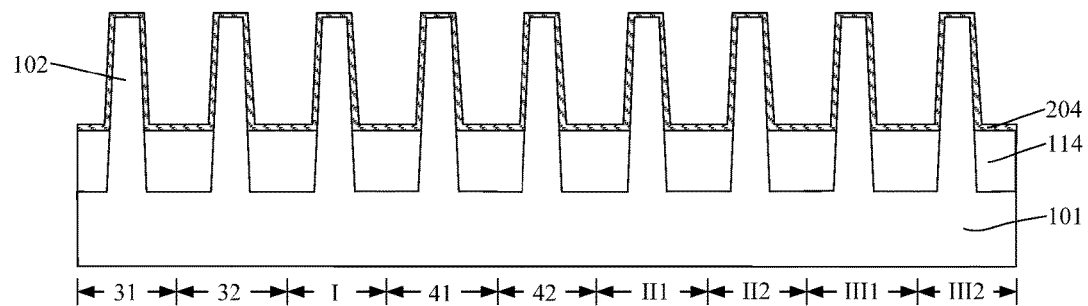

Further, returning to FIG. 13, a gate dielectric layer may be formed on a portion of the base substrate in the N-type logic region, the P-type logic region, the first PD transistor region, the second PD transistor region, and the PG transistor region (S405). FIG. 4 shows a schematic cross-section view of a corresponding semiconductor structure.

Referring to FIG. 4, a gate dielectric layer 204 may be formed on a portion of the base substrate in the N-type logic region, the P-type logic region, the first PD transistor region II1, the second PD transistor region II2, and the PG transistor region.

In one embodiment, the base substrate may also include a PU transistor region I, and accordingly, during the fabrication process for the gate dielectric layer 204, the gate dielectric layer 204 may also be formed on the portion of the base substrate in the PU transistor region I.

In one embodiment, the gate dielectric layer 204 may include an interfacial layer (not shown) and a high-k dielectric layer (not shown) formed on the interfacial layer. Specifically, during the fabrication of the gate dielectric layer 204, the gate dielectric layer 204 may be formed across the fin structures 102 to cover a portion of the top and the sidewall surfaces of each fin structure 102.

The interfacial layer may provide a desired interfacial basis for the formation of the high-k dielectric layer so that the quality of the formed high-k dielectric layer may be improved. As such, the density of interface states between the high-k dielectric layer and the fin structures 102 may be reduced, avoiding undesired effects due to direct contact between the high-k dielectric layer and the fin structures 102. In one embodiment, the interfacial layer may be made of $SiO_x$ or SiON.

In one embodiment, the interfacial layer may be formed by an oxidation process. Moreover, the interfacial layer may be only formed on the portion of the top and the sidewall surfaces exposed by the plurality of fin structures 102. In other embodiments, the interfacial layer may be made by a deposition process, such as chemical vapor deposition (CVD), physical vapor deposition (PVD), and atomic layer deposition (ALD). The interfacial layer may also be formed on the isolation structure.

The high-k dielectric layer may be a dielectric material with a relative dielectric constant greater than the relative dielectric constant of $SiO_x$. In one embodiment, the high-k dielectric material used is $HfO_2$. In other embodiments, the high-k dielectric layer may include HfSiO, HfSiON, HfTaO, HfTiO, HfZrO, $ZrO_2$, and $Al_2O_3$. The high-k dielectric layer may be formed by a CVD, PVD, or ALD process. In one embodiment, the high-k dielectric layer is formed through an ALD process.

In a subsequent process, a WF layer may be formed on the gate dielectric layer 204. In order to provide protection for the gate dielectric layer 204 during the subsequent fabrication process, prior to forming the WF layer, the fabrication process may also include forming a cap layer (not shown) on the gate dielectric layer 204, and then forming an etch stop layer (not shown) on the cap layer.

The cap layer may provide protection for the gate dielectric layer 204, preventing undesired etching damage to the gate dielectric layer 204 during the subsequent etching process. The cap layer may also help prevent the metal ions in a subsequently-formed gate electrode layer from diffusing into the gate dielectric layer 204. In one embodiment, the cap layer is made of TiN. In addition, the cap layer may be formed by an ALD process such that the formed cap layer may demonstrate desired step coverage capability. In other embodiments, the cap layer may be formed by TiSiN, and the cap layer may be formed by a CVD process or a PVD process.

The etch stop layer may be made of a material different from the material used to subsequently form the WF layer. Therefore, during a subsequent etching process performed to etch the WF layer, the etch rate on the etch stop layer may be relatively small, and thus the etch stop layer may serve as a layer to indicate that the etching process performed on the WF layer needs to be stopped. As such etching damages to the gate dielectric layer 204 may be avoided. In one embodiment, the etch stop layer is made of TaN. In addition, the etch stop layer is formed by an ALD process such that the formed etch stop layer may demonstrate desired stop coverage capability. In other embodiment, the etch stop layer may be made of TaSiN, and the etch stop layer may be formed by a CVD process or a PVD process.

The subsequent fabrication process may include forming a WF layer on the gate dielectric layer 204 in each region of the semiconductor device corresponding to the device region. For an N-type device, when the effective WF value of the WF layer is smaller, the threshold voltage of the device is smaller and the thickness of the WF layer is smaller; For a P-type device, when the effective function value of the WF layer is smaller, the threshold voltage of the device is larger, and the thickness of the WF layer is smaller. Further, when the threshold voltage of a device is smaller, the open state current, $I_{on}$, becomes larger accordingly.

In one embodiment, the first N-type TV region 41 is used to form a first N-type device, the second N-type TV region 42 is used to form a second N-type device, and the threshold voltage of the first N-type device is larger than the threshold voltage of the second N-type TV device. Therefore, during the subsequent fabrication process, the WF layers in the first PD transistor region II1 and the second N-type TV region 42 may be formed by a same process and the WF layers in the second PD transistor region II2 and the first N-type TV region 41 may be formed by a same process. Compared to the method in which the first PD transistor region and the second PD transistor region are formed using a same fabrication process as the first N-type TV region, the disclosed fabrication method may reduce the thickness of the WF layer in the second PD transistor region II2, and thus reduce the overall threshold voltage of the PD transistor region. As such, the open-state current of the subsequently-formed PD transistor region may increase, improving the beta ratio and the read margin of the formed memory.

Moreover, the WF layer in the PG transistor region and the WF layer in the first N-type TV may be formed by a same process. Compared to the method in which the PG transistor region and the second N-type TV region are formed by a same fabrication process, the disclosed fabrication method may improve the thickness of the WF layer in the PG transistor region, and thus improve the effective WF value of the WF layer formed in the PG transistor region. Therefore, the disclosed fabrication method may reduce the open-state current of the subsequently-formed PG transistor, and thus improve the beta ratio and the read margin of the formed memory. In addition, because the threshold voltage of the PG transistor may be improved, the leak current in the semiconductor device may be effectively suppressed.

In one embodiment, the first PG transistor region III1, the second PG transistor region III2, and the first N-type TV region 41 may be formed through a same process.

Further, in one embodiment, a first WF layer may be subsequently formed on the gate dielectric layer 204 in the PU transistor region I and a second WF layer may then be formed on the first WF layer. Moreover, the subsequent process to form the first WF layer and the third WF layer in the PU transistor region I may be the same as the subsequent process to form the first WF layer and the third WF layer in the second P-type TV region.

Compared to the method in which the fabrication process performed on the firs P-type TV region is the same as the fabrication process performed on the first P-type TV region, the disclosed fabrication method may reduce the thickness of the WF layer in the PU transistor region I, and thus may increase the effective WF value of the WF layer in the PU transistor region. As such, the threshold voltage of the formed PU transistor may increase, and the open-state current of the formed PU transistor may be reduced. Therefore, the disclosed fabrication method may be conducive to improving the gamma ratio, and thus may improve the write margin of the formed memory.

Figure 5:
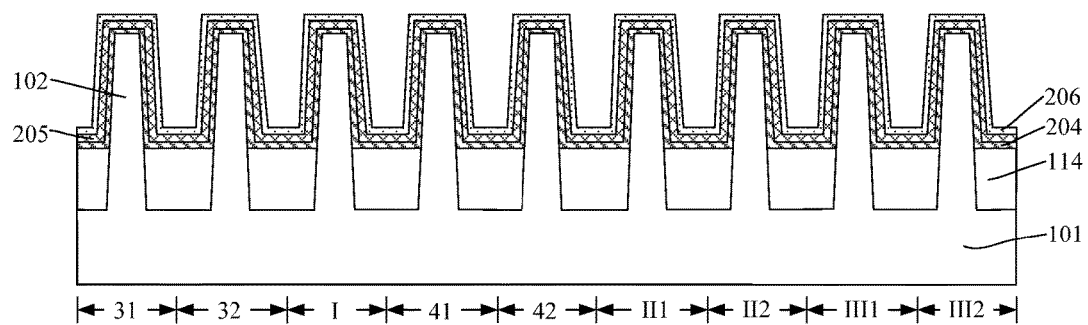

Referring to FIG. 13, a first work function layer may be formed on the surface of the gate dielectric layer (S406). FIG. 5 shows a schematic cross section view of a corresponding semiconductor structure.

Referring to FIG. 5, a first WF layer (not shown) may be formed on the gate dielectric layer 204. In one embodiment, the first WF layer may be formed in the PU transistor region I, the P-type logic region, the N-type logic region, the first PD transistor region II1, the second PD transistor region II2, the first PG transistor region III1, and the second PG transistor region III2.

The first WF layer may be made of a P-type WF material. The P-type WF material may have a WF value in a range of 5.1 eV to 5.5 eV, such as 5.2 eV, 5.3 eV, 5.4 eV, etc. The first WF layer may be made of one or more of Ta, TiN, TaN, TaSiN, and TiSiN. The first WF layer may be formed by a CVD, PVD, ALD, or any other appropriate disposition process.

In one embodiment, after subsequent formation of a second WF layer on the first WF layer, a portion of the second WF layer may be removed. Therefore, in order to avoid undesired damage to the first WF layer during the process to etch the second WF layer, forming the first WF layer on the gate dielectric layer may include forming a first WF material layer 205 on the gate dielectric layer 204 and then forming a second WF material layer 206 on the first WF material layer 205. The first WF material layer 205 and the subsequently-formed second WF layer may be made of a same material, and the second WF material layer 206 may be made of a material different from the material used to form the second WF layer.

In one embodiment, the first WF material layer 205 may be made of TiN, and the second WF material layer 206 may be made of TaN.

The thickness of the first WF layer may be determined based on the threshold voltages of the transistors in the first N-type TV region 41, the second PD transistor region II2, and the PG transistor region. In one embodiment, the thickness of the first WF layer may be in a range of approximately 10 Å to 40 Å.

Figure 6:
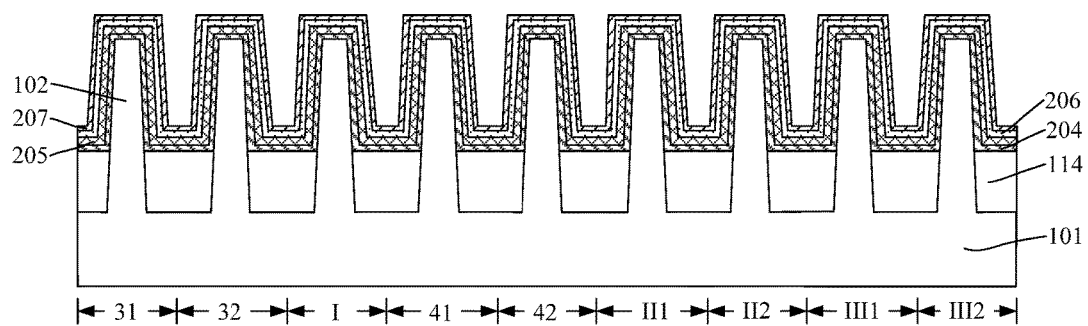

Further, returning to FIG. 13, a second work function layer may be formed on the first work function layer (S407). FIG. 6 shows a schematic cross-section view of a corresponding semiconductor structure.

Referring to FIG. 6, a second WF layer 207 may be formed on the first WF layer. The second WF layer 207 may serve as a portion of the WF layer in the first P-type TV region 31 to improve the threshold voltage of the transistors formed in the first P-type TV region 31.

The second WF layer 207 may be made of a P-type WF material. The second WF layer 207 may be made of one or more of Ta, TiN, TaN, TaSiN, and TiSiN.

The thickness of the second WF layer 207 may be determined based on the threshold voltages of the transistors in the first P-type TV region 31. In one embodiment, the second WF layer 207 is made of TiN, and the thickness of the second WF layer 207 may be in a range of approximately 5 Å to 30 Å.

Further, subsequent fabrication process may include removing the portion of the second WF layer 207 formed in the second P-type TV region 32, the second N-type TV region 42, and the first PD transistor region II1. Moreover, the portion of the first WF layer formed in the second N-type TV region 42 and the first PD transistor region II1 may be removed.

The threshold voltage of the first P-type device formed in the first P-type TV region 31 may be smaller than the threshold voltage of the second P-type device formed in the second P-type TV region 32. Therefore, in one embodiment, by removing the portion of the second WF layer 207 formed in regions other than the first P-type TV region 31, a desired process basis may be provided for subsequent formation of a WF layer with a relatively large thickness on the first P-type TV region 31.

Figure 7:
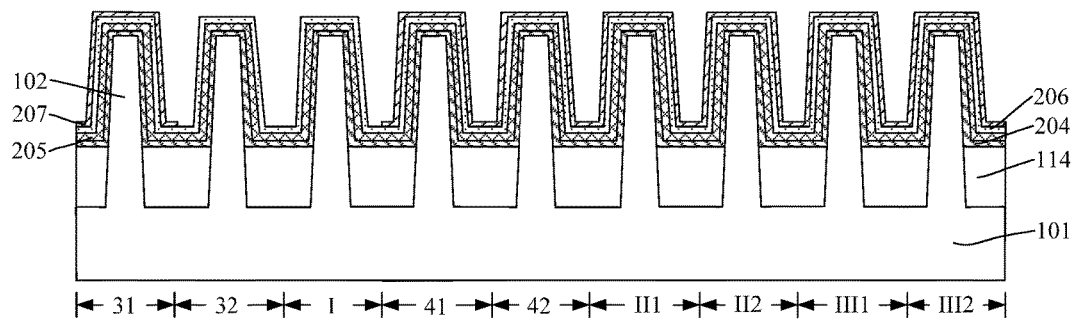

Referring to FIG. 13, a portion of the second work function layer formed in the second P-type TV region may be removed (S408). FIG. 7 shows a schematic cross-section view of a corresponding semiconductor structure.

Referring to FIG. 7, the portion of the second WF layer 207 formed in the second P-type TV region 32 may be removed. In one embodiment, during the process to remove the portion of the second WF layer 207 formed in the second P-type TV region 32, the portion of the second WF layer 207 formed in the PU transistor region I may also be removed. After removing the portion of the second WF layer 207, the portion of the first WF layer formed in the second P-type TV region 32, and the PU transistor region I may be exposed. Because the second WF material layer 206 and the second WF layer 207 may be made of different materials, undesired etching damages to the first WF layer may be avoided.

In one embodiment, the process to remove the portion of the second WF layer 207 may include the following steps. First, a first patterned layer may be formed on the first P-type TV region 31, the N-type logic region, the first PD transistor region II1, the second transistor region II2, and the PG transistor region. The first patterned layer may expose the portion of the second WF layer 207 formed in the second P-type TV region 32 and the PU transistor region I. Further, the exposed portion of the second WF layer 207 may be removed through etching using the first patterned layer as an etch mask. Moreover, the first patterned layer may then be removed.

Figure 8:
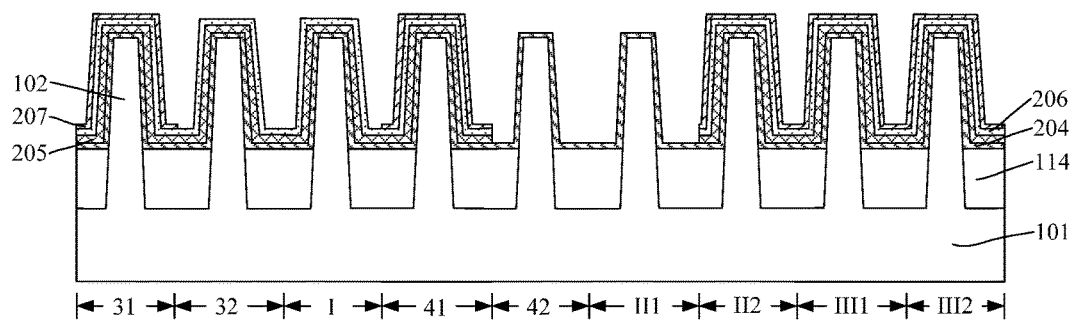

Further, returning back to FIG. 13, the portion of the second work function layer and the first work function layer formed in the second N-type TV region and the first PD transistor region may be removed (S409). FIG. 8 shows a schematic cross-section view of a corresponding semiconductor structure.

Referring to FIG. 8, the portion of second WF layer 207 and the first WF layer formed in the second N-type TV region 42 and the first PD transistor region II1 may be removed.

In one embodiment, the process to remove the portion of the second WF layer 207 and the first WF layer may include the following steps. First, a second patterned layer may be formed on the second WF layer 207 and the exposed portion of the first WF layer. The second patterned layer may expose the portion of the second WF layer 207 formed in the second N-type TV region 42 and the first PD transistor region II1. The exposed portion of the second WF layer 207 and the portion of the first WF layer under the exposed portion of the second WF layer 207 may then be removed through etching using the second patterned layer as an etch mask. Moreover, the second patterned layer may be removed.

In other embodiments, the portion of the second WF layer formed in the second P-type TV region, the second N-type TV region, and the first PD transistor region may be removed first, and the portion of the first WF layer formed in the second N-type TV region and the PD transistor region may then be removed.

Figure 9:
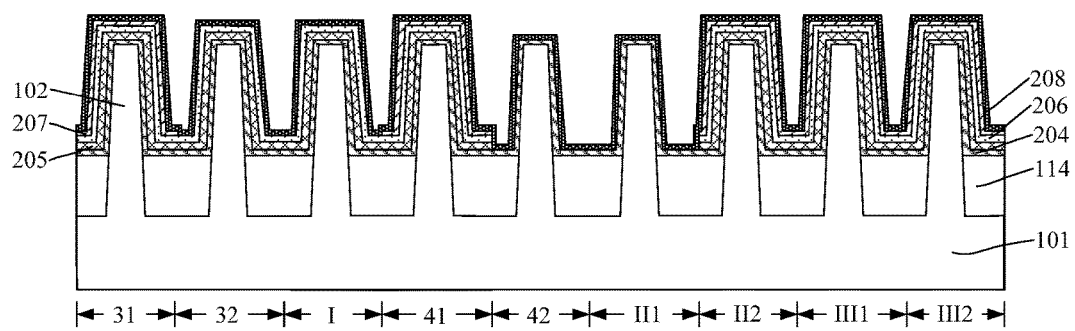

Further, returning to FIG. 13, a third work function layer may be formed on the remaining portion of the second work function layer, the portion of the first work function layer in the second P-type TV region, the portion of the gate dielectric layer 204 in the second N-type TV region and the first PD transistor region (S410). FIG. 9 shows a schematic cross-section view of a corresponding semiconductor structure.

Referring to FIG. 9, a third WF layer 208 may be formed on the remaining portion of the second WF layer 207, the portion of the first WF layer in the second P-type TV region 32, the portion of the gate dielectric layer 204 in the second N-type TV region 42 and the first PD transistor region II1. The thickness of the third WF layer 208 may be smaller than the thickness of the first WF layer.

The third WF layer 208 may serve as a portion of the WF layers in the P-type device, the first PD transistor device, and the second N-type device that are formed subsequently. Because the thickness of the third WF layer 208 is smaller than the thickness of the first WF layer, the thickness of the WF layer formed in the N-type logic region 42 may be smaller than the thickness of the WF layer formed in the first N-type logic region 41. Therefore, the threshold voltage of the second N-type device formed in the second N-type logic device 42 may be smaller than the threshold voltage of the first N-type device formed in the first N-type logic region 41. Moreover, the thickness of the WF layer formed in the first PD transistor region II1 may be smaller than the thickness of the WF layer formed in the second PD transistor region II2 such that the threshold voltage of the first PD transistor may be smaller than the threshold voltage of the second PD transistor.

In the meantime, the thickness of the WF layer in the first PD transistor region II1 and the thickness of the WF layer in the second N-type logic region 41 may both be relatively small such that the threshold voltage of the first PD transistor may be small. Therefore, the open-state current of the first PD transistor may increase, and thus the read margin of the memory may be improved.

The third WF layer 208 may be made of a P-type WF material. For example, the third WF layer 208 may be made of one or more of Ta, TiN, TaN, TiSiN, etc.

Moreover, the thickness of the third WF layer 208 may be determined by the threshold voltage of the transistors formed in the second N-type logic region 42 and the first PD transistor region II1. In one embodiment, the third WF layer may be made of TiN, and the thickness of the third WF layer may be in a range of approximately 5 Å to 20 Å.

Figure 10:
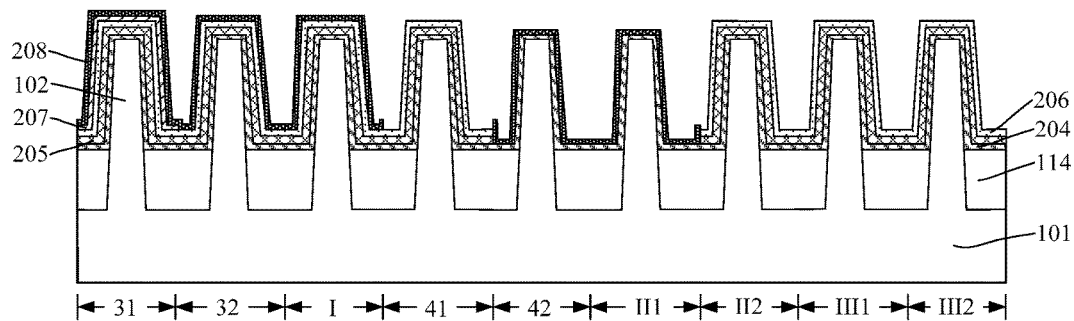
Figure 11:
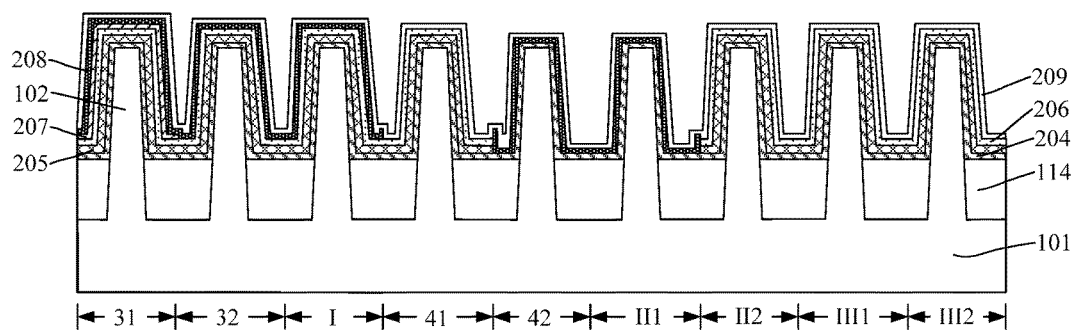

Referring to FIG. 13, the portion of the third work function layer and the second work function layer formed in the first N-type TV region, the second PD transistor region, and the PG transistor region may be removed (S411). FIG. 10 shows a schematic cross-section view of a corresponding semiconductor structure.

Referring to FIG. 10, the portion of the third WF layer 208 and the second WF layer 207 formed in the first N-type TV region 41, the second PD transistor region II2, and the PG transistor region may be removed.

In one embodiment, the process to remove the portion of the third WF layer 208 and the second WF layer 207 may include the following steps. First, a third patterned layer may be formed on the third WF layer 208. The third patterned layer may expose a portion of the third WF layer 208 formed in the first N-type TV region 41, the second PD transistor region II2, and the PG transistor region. The exposed portion of the third WF layer 208 and the portion of the second WF layer 207 under the exposed portion of the third WF layer 208 may be removed through etching using the third patterned layer as an etch mask. Further, the third patterned layer may be removed.

The remaining portion of the third WF layer 208 may serve as a portion of the WF layers in the P-type logic region, the PU transistor region I, the second N-type TV region 42, and the first PD transistor region II1.

Further, returning to FIG. 13, a fourth work function layer may be formed on the exposed portion of the first work function layer as well as the exposed portion of the third work function layer (S412).

In one embodiment, a fourth WF layer 209 may be formed on the portion of the first WF layer in the first N-type TV region 41, the second PD transistor region II2, and the PG transistor region. The fourth WF layer may also be formed on the portion of the third WF layer 208 in the P-type logic region, the PU transistor region I, the second N-type TV region 42, and the first PD transistor region II1.

The fourth WF layer 209 may sever as a portion of the WF layers in the N-type logic region, the PG transistor region, the first PD transistor region II1, and the second PD transistor region II2. The fourth WF layer 209 may be used to adjust the threshold voltages for the first N-type device, the second N-type device, the PG transistor, the first PD transistor, and the second PD transistor that are formed subsequently.

Moreover, in order to save process steps and reduce the frequency of using photomasks, in one embodiment, after forming the fourth WF layer 209, the portion of the fourth WF layer 209 formed in the P-type logic region and the PU transistor region I may be retained.

The fourth WF layer 209 may be made of an N-type WF material. The N-type WF material may have a WF value in a range of approximately 3.9 eV to 4.5 eV, such as 4 eV, 4.1 eV, 4.3 eV, etc. The fourth WF layer 209 may be made of one or more of TiAl, TiAlC, TaAlN, TiAlN, TaCN, AlN, etc. The fourth WF layer 209 may be formed by a CVD, PVD, ALD, or any other appropriate deposition process. In one embodiment, the fourth WF layer 209 is made of TiAl.

The thickness of the fourth WF layer 209 may be determined based on the thickness of the third WF layer 208 and the thickness of the first WF layer, as well as the threshold voltages of the first N-type device, the second N-type device, the first PD transistor, the second PD transistor, and the PG transistor that are formed subsequently. In one embodiment, the thickness of the fourth WF layer 209 is in a range of approximately 40 Å to 60 Å.

Moreover, the first WF layer and the fourth WF layer 209 in the first N-type TV region 41 may be used to form the WF layer in the first N-type device, the first WF layer and the fourth WF layer 209 in the second PD transistor region II2 may be used to form the WF layer in the second PD transistor, and the first WF layer and the fourth WF layer 209 in the PG transistor region may be used to form the WF layer in the PG transistor.

The first WF layer, the second WF layer 207, and the third WF layer 208 in the first P-type TV region 31 may be used to form the WF layer in the first P-type device, the first WF layer and the third WF layer 208 in the second P-type TV region 32 may be used to form the WF layer in the second P-type device, and the first WF layer and the third WF layer 208 in the PU transistor region I may be used to form the WF layer in the PU transistor.

The third WF layer 208 and the fourth WF layer 209 in the second N-type TV region 42 may be used to form the WF layer in the second N-type device, and the third WF layer 208 and the fourth WF layer 209 in the first PD transistor region II1 may be used to form the WF layer in the first PD transistor.

Further, returning to FIG. 13, a gate electrode layer may be formed on the fourth work function layer (S413). FIG. 12 shows a schematic cross-section view of a corresponding semiconductor structure.

Referring to FIG. 12, after forming the fourth WF layer 209, the fabrication method may further include forming a gate electrode layer 211 on the fourth WF layer. In one embodiment, the gate electrode layer 211 may be formed across the N-type logic region, the P-type logic region, the first PD transistor region II1, the second PD transistor region II2, the PU transistor region I, and the PG transistor region. In other embodiments, the gate electrode layer in each region may be isolated from each other.

In one embodiment, the gate electrode layer 211 may be made of one or more of Al, Cu, Ag, Au, Pt, Ni, Ti, W, etc.

For example, the gate electrode layer 211 may be formed by a process including the following steps. First, a gate electrode film may be formed on the fourth WF layer 209. The top surface of the gate electrode film may be higher than the top surface of the interlayer dielectric layer (not shown). Further, the portion of the gate electrode film formed above the top surface of interlayer dielectric layer may be removed through polishing to form the gate electrode layer 211.

According to the disclosed methods for fabricating semiconductor devices, the WF layer in the first PD transistor region and the WF layer in the second N-type TV region may be formed by a same process, and the WF layer in the second PD transistor region and the WF layer in the first N-type TV region may be formed by a same process. In addition, the threshold voltage of the N-type device in the second N-type TV region may be smaller than the threshold voltage of the N-type device in the first N-type TV region. According to conventional methods, the WF layers in the first PD transistor region and the second PD transistor region and the WF layer in the first N-type TV region are formed by a same process. Therefore, compared to the threshold voltage of the PD transistor fabricated by conventional methods, the threshold voltage of the PD transistor fabricated by the disclosed methods may be smaller. As such, the open-state current of the PD transistors may increase, the beta ratio of the memory in the semiconductor device may be improved, and the read margin may also be improved.

Moreover, the fabrication process for the WF layer in the PG transistor region may be the same as the fabrication process for the WF layer in the first N-type TV region. According to conventional methods, the WF layer in the PG transistor region and the WF layer in the second N-type TV region are formed by a same process. Therefore, compared to the threshold voltage of the PG transistor fabricated by conventional methods, the threshold voltage of the PG transistor region fabricated by the disclosed methods may be larger. As such, the open-state current of the PG transistor may be reduced, the beta ratio of the memory in the semiconductor device may be improved, and the read margin may also be improved.

Corresponding to the disclosed fabrication methods, the present disclosure also provides a semiconductor device. FIG. 12 illustrates a schematic cross-section view of a semiconductor device consistent with various embodiments of the present disclosure.

Referring to FIG. 12, the semiconductor device may include a base substrate. The base substrate may include an N-type logic region, a P-type logic region, a first PD transistor region II1, a second PD transistor region II2, and a PG transistor region. The N-type logic region may include a first N-type TV region 41 including a first N-type device, and a second N-type TV region 42 including a second N-type device. Moreover, the threshold voltage of the first N-type device may be larger than the threshold voltage of the second N-type device. The P-type logic region may include a first P-type TV region 31 including a first P-type device, and a second P-type TV region 32 including a second P-type device. Moreover, the threshold voltage of the first P-type device may be smaller than the threshold voltage of the second P-type device.

The semiconductor device may also include a gate dielectric layer 204 formed on a portion of the base substrate in the N-type logic region, the P-type logic region, the first PD transistor region II1, the second PD transistor region II2, and the PG transistor, a first WF layer formed on the gate dielectric layer 204 in the P-type logic region, the first N-type TV region 41, the second PD transistor region II2, and the PG transistor region, a second WF layer 207 formed on the first WF layer in the first P-type TV region 31, and a third WF layer 208 formed on the gate dielectric layer 204 in the second N-type TV region 42 and the first PD transistor region II1, the second WF layer 207 in the first P-type TV region 31, and the first WF layer in the second P-type TV region 32. The thickness of the third WF layer 208 may be smaller than the thickness of the first WF layer.

The semiconductor device may further include a fourth WF layer 209 formed on the first WF layer in the first N-type TV region 41, the second PD transistor region II2, and the PG transistor region. The fourth WF layer 209 may also be formed on the third WF layer 208 in the P-type logic region, the second N-type TV region 42, and the first PD transistor region II1.

In one embodiment, the base substrate of the semiconductor device may also include a PU transistor region I. The PU transistor region I may be a PMOS region. Accordingly, the gate dielectric layer 204 may also be formed on the substrate in the PU transistor region I. In addition, the first WF layer may be formed on the gate dielectric layer 204 in the PU transistor region I, and the third WF layer 208 may be formed on the first WF layer in the PU transistor region I. Moreover, the fourth WF layer 209 may also be formed on the third WF layer 208 in the PU transistor region I.

In one embodiment, the PG transistor region may include a first PG transistor region III1 and a second PG transistor region III2. Further, a first PG transistor may be formed in the first PG transistor region III1, and a second PG transistor may be formed in the second PG transistor region III2.

In one embodiment, the semiconductor device is a FinFET device. The base substrate may include a substrate 101 and a plurality of discrete fin structures 102 formed on the substrate 101. The base substrate may also include an isolation structure 114 formed on the portion of the substrate 101 exposed by the plurality of fin structures 102. The isolation structure 114 may cover a portion of the sidewall surfaces of each fin structure 102 and the top surface of the isolation structure 114 may be lower than the top surfaces of the fin structures 102.

The detailed descriptions of the base substrate and the gate dielectric layer 204 may refer to the above illustration of the disclosed fabrication methods.

In one embodiment, the first WF layer may include a first WF material layer 205 and a second WF material layer 206 formed on the first WF material layer 205. In addition, the first WF material layer 205 and the second WF layer 207 may be made of a same material, and the second WF material layer 206 may be made of a material different from the material used to form the second WF layer 207.

The first WF material layer 205 may be made of one or more of Ta, TiN, TaN, TaSiN, and TiSiN. The second WF material layer 206 may be made of one or more of Ta, TiN, TaN, TaSiN, and TiSiN. The second WF layer 207 may be made of one or more of Ta, TiN, TaN, TaSiN, and TiSiN. The third WF layer 208 may be made of one or more of Ta, TiN, TaN, TaSiN, and TiSiN.

In one embodiment, the first WF material layer 205, the second WF layer 207, and the third WF layer 208 are made of TiN, and the second WF material layer 206 is made of TaN.

In one embodiment, the thickness of the first WF layer is in a range of approximately 10 Å to 40 Å, the thickness of the second WF layer 207 is in a range of approximately 5 Å to 30 Å, and the thickness of the third WF layer 208 is in a range of approximately 5 Å to 20 Å.

The fourth WF layer 209 may be made of TiAl, TiAlC, TaAl, TaAlC, TiAlN, TaCN, or AlN. In one embodiment, the fourth WF layer 209 is made of TiAl.

The semiconductor device may also include a gate electrode layer 211 formed on the fourth WF layer 209.

For an NMOS device, when the corresponding WF layer becomes thicker, the effective WF value of the NMOS device is larger, and the corresponding threshold voltage of the NMOS device is also larger. For the first N-type device, the second PD transistor, and the PG transistor, the corresponding WF layer may have a multiple-layer structure formed by the first WF layer and the fourth WF layer 209. For the second N-type device and the first PD transistor, the corresponding WF layer may have a multiple-layer structure formed by the third WF layer 208 and the fourth WF layer 209.

Further, because the thickness of the first WF layer is larger than the thickness of the third WF layer, the effective WF value of the first N-type device, the second PD transistor, and the PG transistor may be larger than the effective WF value of the second N-type device and the first PD transistor. Therefore, the threshold voltage of the first PD transistor may be relatively small such that the open-state current of the PD transistor formed by the first PD transistor and the second PD transistor may increase. Moreover, the threshold voltage of the PG transistor may become relatively large such that the open-state current of the PG transistor may be reduced. As such, the beta ratio of the disclosed semiconductor device may increase, the read margin of the semiconductor device may be improved, and the electrical performance of the semiconductor device may also be improved.

Further, the WF layer in the PU transistor region is the same as the WF layer of the second P-type device in the second P-type TV region. Therefore, the thickness of the WF layer in the PU transistor region is relatively small such that the effective WF value of the PU transistor may be relatively large. Accordingly, the threshold voltage of the PU transistor may be improved, and the open-state current of the PU transistor may be reduced. As such, the gamma ratio of the semiconductor device may be improved, and thus the write margin of the semiconductor device may be improved.

Compared to conventional fabrication methods and semiconductor devices, the disclosed fabrication methods and semiconductor devices may demonstrate several advantages.

For example, according to the disclosed fabrication methods and semiconductor devices, during forming a first N-type device and a second N-type device with different threshold voltages and also forming a first P-type device and a second P-type device with different threshold voltages, a first PD transistor, a second PD transistor, and a PG transistor may also be formed. The threshold voltage of the first N-type device may be larger than the threshold voltage of the second N-type device. Accordingly, the thickness of the WF layer of the first N-type device may be larger than the thickness of the WF layer of the second N-type device. In addition, the WF layer of the first PD transistor and the WF layer of the second N-type device may be formed by a same process, the WF layer of the second PD transistor and the WF layer of the first N-type device may be formed by a same process, and the WF layer of the PG transistor and the WF layer of the first N-type device may also be formed by a same process. Therefore, the threshold voltage of the second PD transistor may be smaller than the threshold voltage of the first PD transistor. According to conventional fabrication methods and semiconductor devices, the threshold voltage of the second PD transistor is the same as the threshold voltage of the first PD transistor. Therefore, compared to the open-state current of the PD transistors in conventional semiconductor devices, the open-state current of the PD transistors formed by the first PD transistor and the second PD transistor in the disclosed semiconductor devices may be increased. Moreover, compared to the threshold voltage of the PG transistor in conventional semiconductor devices, the threshold voltage of the PG transistor in the disclosed semiconductor devices may be larger, which further leads to a smaller open-state current of the PG transistor. As such, the disclosed fabrication methods and the semiconductor devices may improve the beta ratio of the memories in the formed semiconductor device, improve the read margin of the memories, and optimize the electrical performance of the semiconductor device.

In certain embodiments, the base substrate of the semiconductor devices may also include a PU transistor region. In addition, the gate dielectric layer, the first WF layer, and the third WF layer may be formed in the PU transistor region. The process to form the first WF layer and the third WF layer in the PU transistor region may be the same as the process to form the first WF layer and the third WF layer in the second P-type TV region such that the effective WF value of the WF layer in the PU transistor region may be improved. Therefore, the threshold voltage of the PU transistor may be improved, and thus the open-state current of the PU transistor may be reduced. As such, the disclosed fabrication methods and the semiconductor devices may improve the gamma ratio of the memories, and thus improve the write margin of the memories.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
providing a base substrate including an N-type logic region, a P-type logic region, a first pull down (PD) transistor region, a second PD transistor region, and a pass gate (PG) transistor region, wherein the N-type logic region includes a first N-type threshold-voltage (TV) region used to form a first N-type device and a second N-type TV region used to form a second N-type device, the P-type logic region includes a first P-type TV region used to form a first P-type device and a second P-type TV region used to form a second P-type device;
forming a gate dielectric layer on a portion of the base substrate in the N-type logic region, the P-type logic region, the first PD transistor region, the second PD transistor region, and the PG transistor region;

forming a first work function (WF) layer on the gate dielectric layer in the first N-type TV region, the P-type logic region, the second PD transistor region, and the PG transistor region;

forming a second WF layer on the first WF layer in the first P-type TV region;

forming a third WF layer on the second WF layer in the first P-type TV region, the first WF layer in the second P-type TV region, and the gate dielectric layer in the second N-type TV region and the first PD transistor region, wherein a thickness of the third WF layer is smaller than a thickness of the first WF layer; and forming a fourth WF layer on the third WF layer in the P-type logic region, the second N-type TV region, and the first PD transistor region, and on the first WF layer in the first N-type TV region, the second PD transistor region, and the PG transistor region.

2. The method for fabricating the semiconductor device according to claim 1, wherein:
a threshold voltage of the first N-type device is larger than a threshold voltage of the second N-type device; and
a threshold voltage of the first P-type device is smaller than a threshold voltage of the second P-type device.

3. The method for fabricating the semiconductor device according to claim 1, wherein
forming the first WF layer, the second WF layer and the third WF layer includes:
forming the first WF layer on the gate dielectric layer;
forming the second WF layer on the first WF layer;
removing a portion of the second WF layer in the second P-type TV region, the second N-type TV region, and the first PD transistor region;
removing a portion of the first WF layer in the second N-type TV region and the first PD transistor region;
forming the third WF layer on a remaining portion of the second WF layer, the first WF layer in the second P-type TV region, and the gate dielectric layer in the second N-type TV region and the first PD transistor region; and
removing a portion of the third WF layer and the second WF layer in the first N-type TV region, the second PD transistor region, and the PG transistor region.

4. The method for fabricating the semiconductor device according to claim 3, wherein
forming the first WF layer on the gate dielectric layer includes:
forming a first WF material layer on the gate dielectric layer; and
forming a second WF material layer on the first WF material layer, wherein:
the second WF material layer and the first WF material layer together form the first WF layer,
the first WF material layer and the second WF layer are made of a same material, and
the second WF material layer and the second WF layer are made of different materials.

5. The method for fabricating the semiconductor device according to claim 4, wherein:
the first WF material layer is made of at least one of Ta, TiN, TaN, TaSiN, and TiSiN;
the second WF material layer is made of at least one of Ta, TiN, TaN, TaSiN, and TiSiN;
the second WF layer is made of at least one of Ta, TiN, TaN, TaSiN, and TiSiN;

the third WF layer is made of at least one of Ta, TiN, TaN, TaSiN, and TiSiN; and
the fourth WF layer is made of at least one of TiAl, TiAlC, TaAl, TaAlC, TiAlN, TaCN, and AlN.

6. The method for fabricating the semiconductor device according to claim 3, wherein:
the first WF material layer, the second WF layer, and the third WF layer are made of TiN;
the second WF material layer is made of TaN;
the thickness of the first WF layer is in a range of approximately 10 Å to 40 Å;
a thickness of the second WF layer is in a range of approximately 5 Å to 30 Å;
the thickness of the third WF layer is in a range of approximately 5 Å to 20 Å; and
a thickness of the fourth WF layer is in a range of approximately 40 Å to 60 Å.

7. The method for fabricating the semiconductor device according to claim 3, wherein removing the portion of the second WF layer in the second P-type TV region, the second N-type TV region, and the first PD transistor region as well as the portion of the first WF layer in the second N-type VT region and the first PD transistor region includes:
removing the second WF layer in the second P-type TV region; and
removing both the second WF layer and the first WF layer in the second N-type TV region and the first PD transistor region.

8. The method for fabricating the semiconductor device according to claim 1, after forming the gate dielectric layer and prior to forming the first WF layer, further including:
forming a cap layer on the gate dielectric layer; and
forming an etch stop layer on the cap layer, wherein:
the cap layer is made of TiN or TiSiN, and
the etch stop layer is made of TaN or TaSiN.

9. The method for fabricating the semiconductor device according to claim 1, wherein:
the PG transistor region includes a first PG transistor region used to form a first PG transistor and a second PG transistor region used to form a second PG transistor.

10. The method for fabricating the semiconductor device according to claim 1, wherein:
the base substrate also includes a pull up (PU) transistor region;
the gate dielectric layer is formed in the PU transistor region, the first WF layer is formed on the gate dielectric layer in the PU transistor region, and the third WF layer is formed on the first WF layer in the PU transistor region;
the first WF layer in the PU transistor region is formed simultaneously with the first WF layer in the second P-type TV region; and
the third WF layer in the PU transistor region is formed simultaneously with the third WF layer in the second P-type TV region.

11. The method for fabricating the semiconductor device according to claim 1, wherein the second N-type TV region includes an N-type ultra-low threshold-voltage (ULTV) region and an N-type low threshold-voltage (LTV) region, the first N-type TV region is an N-type standard TV region, the first P-type TV region includes a P-type ULTV region and a P-type LTV region, and the second P-type TV region is a P-type standard TV region, and wherein, prior to forming the gate dielectric layer:
a first N-type TV doping adjustment process is performed on the base substrate in the N-type ULTV region;

a second N-type TV doping adjustment process is performed on the base substrate in the N-type LTV region;

a first P-type TV doping adjustment process is performed on the base substrate in the P-type ULTV region; and a second P-type TV doping adjustment process is performed on the base substrate in the P-type LTV region.

12. The method for fabricating the semiconductor device according to claim 1, after forming the fourth WF layer, further including:

forming a gate electrode layer on the fourth WF layer.

13. The method for fabricating the semiconductor device according to claim 1, wherein:

the base substrate includes a substrate and a plurality of fin structures formed on the substrate; and the gate dielectric layer is formed across the fin structures and covers a portion of top and sidewall surfaces of the fin structures.

\* \* \* \* \*